United States Patent [19]

Lee

[11] Patent Number: 5,220,680
[45] Date of Patent: Jun. 15, 1993

[54] FREQUENCY SIGNAL GENERATOR APPARATUS AND METHOD FOR SIMULATING INTERFERENCE IN MOBILE COMMUNICATION SYSTEMS

[75] Inventor: William C. Y. Lee, Corona del Mar, Calif.

[73] Assignee: PacTel Corporation, Walnut Creek, Calif.

[21] Appl. No.: 641,507

[22] Filed: Jan. 15, 1991

[51] Int. Cl.⁵ .............................................. H04B 1/04
[52] U.S. Cl. ........................................ 455/102; 455/1;
455/33.1; 455/112; 455/118
[58] Field of Search ....................... 455/1, 33.1, 59, 61,
455/67.1, 67.4, 102, 112, 115, 118, 314, 315

[56] References Cited

U.S. PATENT DOCUMENTS

| | | | |
|---|---|---|---|
| 4,296,496 | 10/1981 | Sadler | 455/1 |
| 4,317,214 | 2/1982 | Attinello | 455/1 |
| 4,977,376 | 12/1990 | Schiek et al. | 455/315 X |

Primary Examiner—Reinhard J. Eisenzopf
Assistant Examiner—Chi H. Pham
Attorney, Agent, or Firm—McCubbrey, Bartels, Meyer & Ward

[57] ABSTRACT

This invention is a multiple-frequency signal generator apparatus and method primarily for simulating a cell site interference environment for electromagnetic communications systems. The generator can produce a plurality of frequencies having a frequency-spacing of d cycles per second. The invention comprises a single frequency multiplier, at least three oscillators and two mixers for providing a multitude of frequencies closely spaced about a carrier frequency. The simple design and components avoid complexity and save costs.

12 Claims, 3 Drawing Sheets

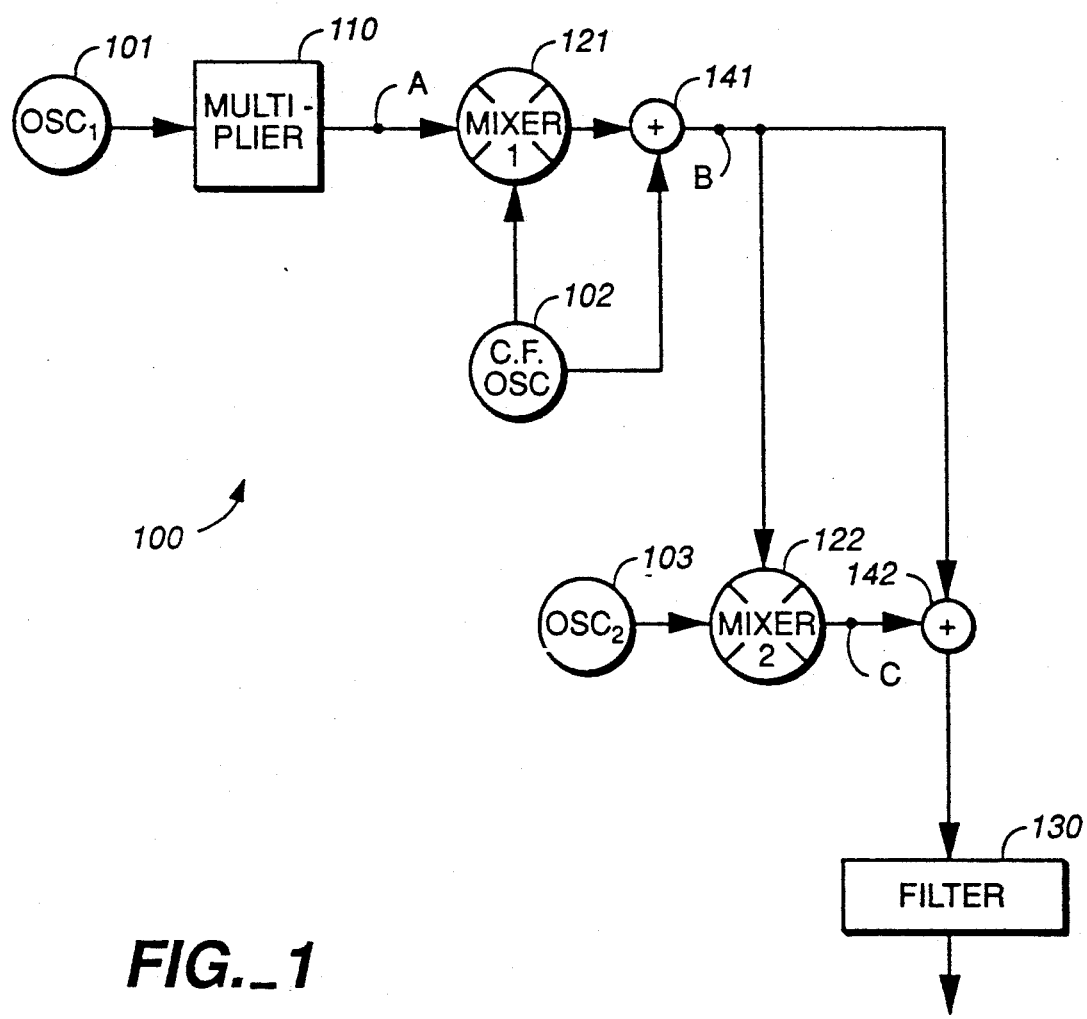
FIG._1

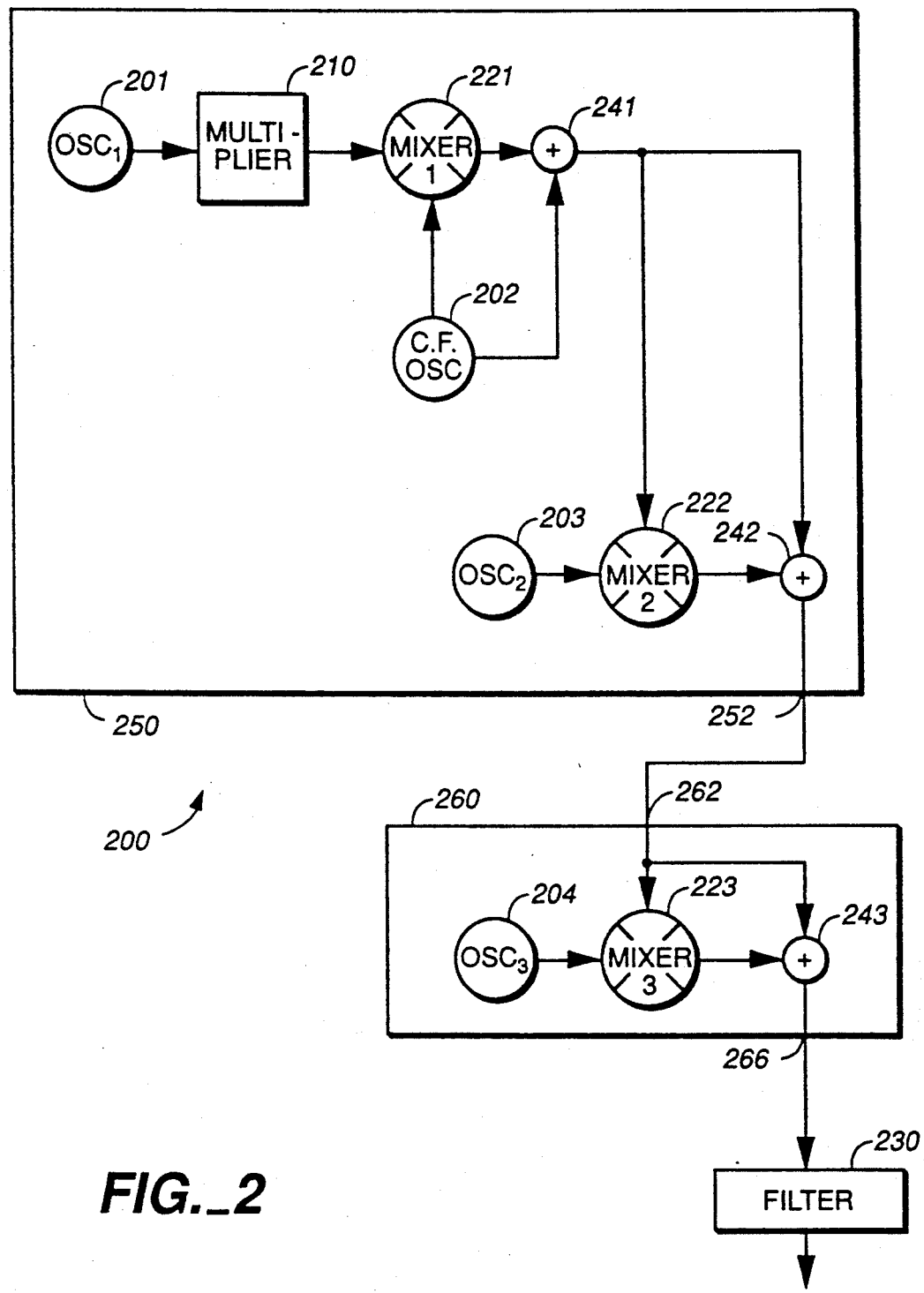
FIG._2

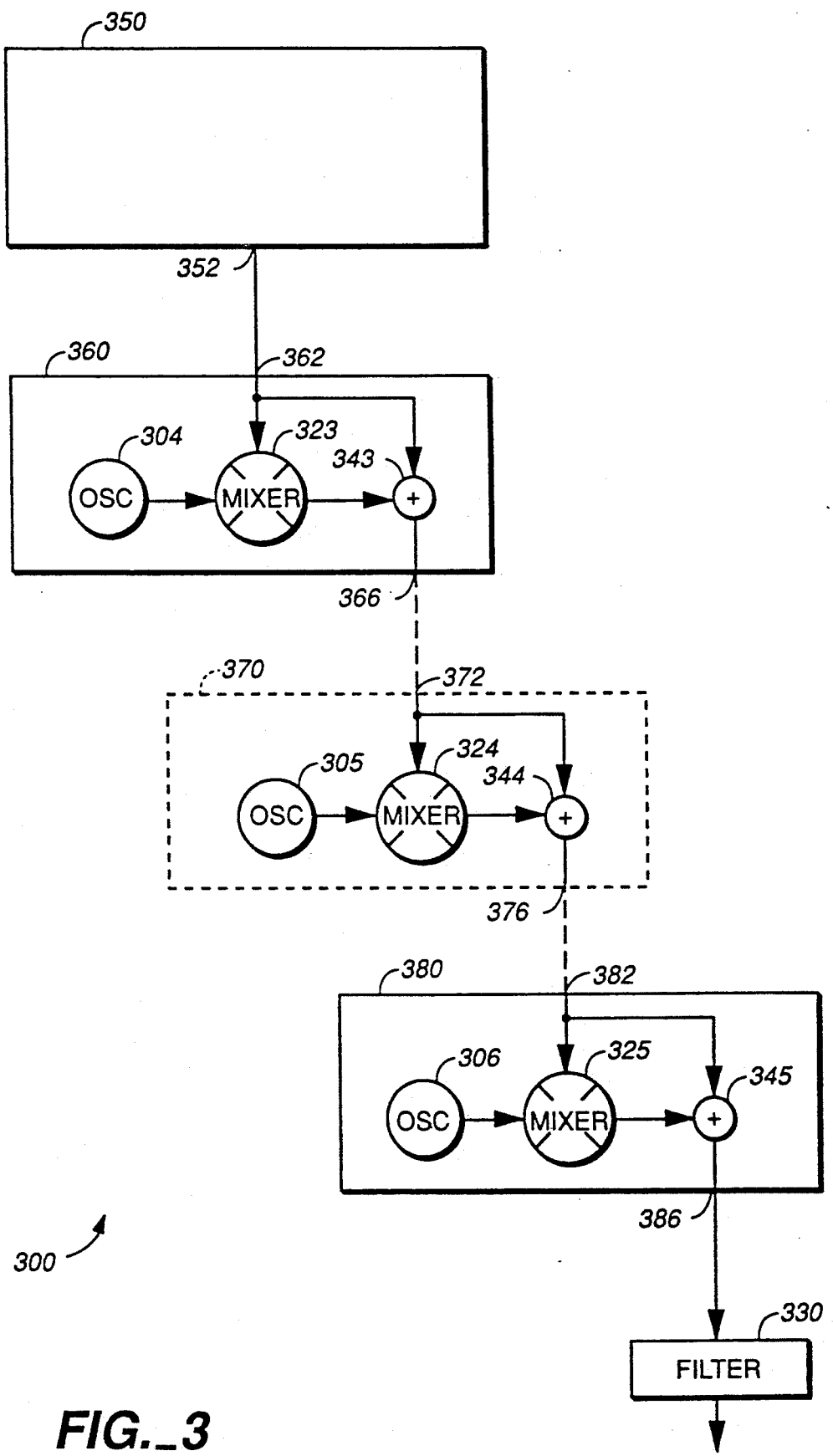
FIG._3

FREQUENCY SIGNAL GENERATOR APPARATUS AND METHOD FOR SIMULATING INTERFERENCE IN MOBILE COMMUNICATION SYSTEMS

FIELD OF THE INVENTION

The present invention relates generally to testing communications systems and more particularly to a frequency generating circuit for simulating interference in mobile communications systems.

BACKGROUND OF THE INVENTION

Mobile telephone cellular communications systems divide geographic areas into cells, each cell being served by a cell site having a transmitter and receiver.

When a user in a car (the "mobile unit") desires to make a call, the mobile telephone unit scans the set-up channels, selects the strongest and locks on for a certain time. Each cell site is assigned a different set-up channel, so locking on to the strongest usually means selecting the nearest cell site.

A call request sent from the mobile unit is received by a cell site which typically selects a directive antenna for the communications channel. At the same time, the cell site also sends a request for a voice channel to the Mobile Telephone Switching Office (MTSO) via a high-speed data link. The MTSO selects an appropriate voice channel for the call and the cell site links the channel with the directive antenna to the mobile unit. The MTSO also connects the wire-line party through the telephone company central office.

A call from a land-line party to a mobile unit goes first to the telephone company central office which recognizes that the number is for a mobile unit and forwards the call to the MTSO. The MTSO sends a paging message to certain cell sites based on the mobile unit number and a search algorithm. Each cell site transmits the page on its own set-up channel. The mobile unit recognizes its own identification on a strong set-up channel, locks onto it, and responds to the cell site instruction to tune to an assigned voice channel.

Communications with mobile units passing from one cell to another are maintained by handoff schemes whereby cell sites transfer the communications between each other.

A core concept of cellular mobile communications systems is the reuse of frequency channels in order to increase the efficiency of use of a limited allocated spectrum. In a frequency reuse system, users in different geographic locations (different cells) simultaneously use the same frequency channel. This increases the spectrum use efficiency, but also may produce serious interference problems. Interference due to the common use of the same channel is called cochannel interference.

The minimum distance between cells using the same channel depends on factors such as the number of co-channel cells in the vicinity, the terrain, antenna heights, and transmission power at each cell site. To maximize spectrum utilization efficiency, it is necessary to minimize the distance between cells using the same channel while maintaining a sufficiently low level of cochannel interference. A comprehensive discussion of minimum distance and cochannel interference can be found in *Mobile Cellular Telecommunications Systems*, Chapter 2, (McGraw-Hill 1989) by William C. Y. Lee.

It is a difficult undertaking to accurately determine the areas of serious cochannel interference in a mobile communications system. A first test, simply described, involves transmitting on one channel at night while the mobile unit travels in one of the cochannel cells. A field-strength recorder in the mobile unit monitors changes in signal compared with the condition of no cochannel transmission. The test must be repeated as the mobile unit travels in every cochannel cell. A channel scanning receiver in the mobile unit records the signal level on the no-cochannel condition on one channel, the interference level on another channel, and a third non-utilized channel. By comparing the signal levels in the channels, the sufficiency of coverage may be estimated and the areas of cochannel interference spotted.

A second test involves, in a first approach, simultaneously using mobile units travelling in each cochannel cell and monitoring the signal levels. Since it is difficult to use multiple mobile units simultaneously, an alternative approach is to use a single moving mobile unit in one of the cochannel cells at a time and to record the signal strength at every other cochannel cell site. By determining the highest and lowest average signal strengths, the carrier-to-interference ratio received at a particular cell may be estimated. For details of these tests, see *Mobile Cellular Telecommunications Systems*, Chapter 6, (McGraw-Hill 1989) by William C. Y. Lee.

Real-time cochannel interference measurements at the mobile transceivers are difficult to achieve in practice. Simply stated, this is because the sampling delay time must be sufficiently small such that both the amplitudes of the signal and the interference have not changed appreciably in the interim. A description of this problem can be found on pages 183-184 of Lee's book supra.

The determination of cochannel interference in practice is clearly difficult and the estimation of cochannel interference is crucial to the design of cellular mobile communications systems. Thus, it would be a significant advance in the art to have a frequency generator which can generate a realistic sequence of frequencies to simulate cochannel interference in a mobile communications system.

There are also other kinds of interference in mobile communications system, termed "noncochannel interference." "Adjacent-channel interference" includes next-channel (the channel next to the operation channel) and neighboring-channel (more than one channel away for the operating channel) interference. Next-channel interference must originate at other cell sites. This is because any channel combiner at the cell site must combine the selected channels. Therefore, next-channel interference will arrive at the mobile unit from other cell sites if the system is not designed properly. Also, a mobile unit initiating a call on a control channel in a cell may cause interference with the next control channel at another cell site.

Neighboring-channel interference typically results when all the channels are simultaneously transmitting at one cell site. Avoidance of interference problems requires a sufficient amount of band isolation between channels.

Further, there is a type of adjacent-channel interference that is unique to mobile communications systems. Since many mobile units are in motion simultaneously, their relative positions change with time. Some mobile units are close to the cell site and some are not. The close-in mobile units have strong signals which cause adjacent-channel interference. This type of interference is called near-end/far-end interference. There also can be interference between different mobile communications systems. That is, if a mobile unit in one system is closer to a cell site of another system while a call is initiated through the first system, then adjacent channel interference may be produced.

Finally, because some UHF television channels overlap cellular mobile channels, there may be UHF TV signal interference with mobile cellular signals. There may also be interference from long-distance telephone communications.

The communications environment itself contains naturally occurring non-linear junctions (such as buildings and other structures) which act upon transmitted signals to generate cross-products or intermodulation products between simultaneously transmitted signals. These products generate signals having frequencies the same or nearly the same as those carrying desired information and can thus be sources of interference.

Operable designs of mobile communications systems must consider the various kinds of interference described above. Many methods and devices to reduce interference are discussed in *Mobile Cellular Telecommunications Systems,* Chapter 7, (McGraw-Hill 1989) by William C. Y. Lee. The choice of an optimum system design requires knowledge of the effects of interference. This knowledge can be gained by field testing through reproduction of the interference environment or by computer simulation. Computer simulation has the disadvantage that it does not allow a physical test of all the equipment and personnel. Thus, the best test of a mobile communications system is a subjective voice-quality monitoring for a given carrier-to-noise ratio. Therefore, there is a distinct need for an interference simulating device to subjectively test the voice quality of mobile communications systems and to rapidly and accurately identify which of a multitude of frequencies are causing the interference.

Prior art interference frequency generators include U.S. Pat. No. 4,317,214 to Attinello which injects interference signals into a receiver to simulate environmental interference effects. The types of interference injected include white noise, pseudo-random pulses, sawtooth or comb signals and other types of signal distortion.

U.S. Pat. No. 3,806,809 to Firman discloses a frequency generator simulating intermodulation interference. The generator produces, mixes, and non-linearly amplifies harmonic and beat frequencies of the carrier signal to produce a spectrally-expanded composite signal. This composite signal can then be analyzed for the main interference component affecting the carrier signal.

The prior art described above can not, however, produce frequencies with spacing of less than 150 Khz from a single multiplier. Such close frequency spacing is necessary to adequately and realistically simulate the signal transmissions from mobile communication cell sites.

SUMMARY OF THE INVENTION

Accordingly, it is a principal object of the present invention to provide an apparatus and method to test communications systems in the field and in the laboratory.

It is another object of the present invention to provide a cell site simulator which adequately and realistically produces signals representative of a mobile communications system cell site.

It is a further object of the present invention to provide a low-cost, high resolution interference simulator system.

It is yet a further object of the present invention to provide a cell site simulator producing close frequency-spaced signals utilizing a single multiplier.

This invention is a multiple-frequency signal generator apparatus and method primarily for simulating an interference environment for electromagnetic communications systems. A plurality of frequencies having a predetermined frequency-spacing is generated. A first signal generator generates a signal having a first predetermined frequency. A frequency multiplier, coupled to the signal generator, provides signals having frequencies which are integral multiples of the first predetermined frequency. A carrier signal generator provides a carrier signal having a carrier frequency. A first mixer mixes the multiplier signals and the carrier signal to generate signals having frequencies being the sums and differences between the carrier frequency and the frequencies of the signals generated by the multiplier. A second signal generator generates a signal having a second predetermined frequency. A second mixer mixes the signals from the first mixer, the carrier signal generator and the second predetermined frequency signal. Finally, a filter, coupled to the carrier signal generator and the first and second mixers, filters the signals therefrom. A series of frequencies having a predetermined frequency-spacing is thereby produced utilizing only one multiplier.

The interference simulator is particularly useful for testing mobile communications systems by providing a plurality of signals which are closely-spaced in the frequency domain, thereby effectively simulating a cell site. The invention achieves the multiple, closely-spaced frequencies utilizing only a single multiplier and simple components thereby avoiding complexity and saving costs.

A further understanding of the nature and advantages of the present invention may be realized by reference to the Detailed Description of the Invention and the attached drawings.

BRIEF DESCRIPTION OF THE DRAWINGS

FIG. 1 is a block diagram of a frequency generation circuit using two mixers for use in a mobile communications system according to the present invention.

FIG. 2 is a block diagram of a frequency generation circuit using three mixers for use in a mobile communications system according to the present invention.

FIG. 3 is a block diagram of a frequency generation circuit using N mixers for use in a mobile communications system according to the present invention.

DETAILED DESCRIPTION OF THE INVENTION

A signal generator which adequately simulates cell site signal transmissions must be able to generate a sequence of signals with frequency spacings of less than 150 Khz. To save costs and avoid complexity, the signal generator preferably generates signals from a single multiplier. The present invention has the capability to generate adequate sets of frequencies separated by sufficiently small differences from a single multiplier and other simple circuit components.

FIG. 1 shows an embodiment of the present invention providing 60 frequencies and 90 Khz separation. An interference simulator frequency generator is shown at 100. A first frequency-spacing oscillator 101 generating a 270 Khz signal is coupled to a multiplier 110 which multiplies the 270 KHz signal 10 times to produce signal frequencies of 270, 540, 810, 1080, 1350, 1620, 1890, 2160, 2430, and 2700 KHz. These signals are present at node A. Multiplier 110 is coupled to a first mixer 121 which is coupled to a carrier-frequency oscillator 102. Oscillator 102 generates a carrier signal having a carrier frequency of 882.82 MHz. Mixer 121 mixes the ten signals at node A with the 882.820 MHz signal from oscillator 102 to produce twenty signals. The outputs of mixer 121 and carrier frequency oscillator 102 are coupled to a first summation block 141. As a result, the signals present at node B are the twenty signals generated by mixer 121 plus the 882.820 MHz signal. These node B signals have frequencies (by adding the node A signals in turn to the oscillator 102 signal) 883.09, 883.36, 883.63, 883.90, 884.17, 884.44, 884.71, 884.98, 885.25, and 885.52 MHz, and (by subtracting the node A signals in turn from the oscillator 102 signal) 882.55, 882.28, 882.01, 881.74, 881.47, 881.20, 880.93, 880.66, 880.39, 880.12 MHz and (by including the oscillator 102 signal) 882.820 MHz.

Node B is coupled to a second mixer 122 which is coupled to a second frequency-spacing oscillator 103 generating a 90 KHz signal. This produces at node C signals having frequencies (by adding 90 KHz to each node B signal) 883.18, 883.45, 883.72, 883.99, 884.26, 884.53, 884.80, 885.07, 885.34, 885.61, 882.64, 882.37, 882.10, 881.83, 881.56, 881.29, 881.02, 880.75, 880.48, 880.21 and 882.91, and (by subtracting 90 KHz from each node B signal) 883.00, 883.27, 883.54, 883.81, 884.08, 884.35, 884.62, 884.89, 885.16, 885.43, 882.46, 882.19, 881 92, 881.65, 881.38, 881.11, 880.84, 880.57, 880.30, 880.03, and 882.73 MHz.

Node B and node C are coupled to a second summation block 142. The resulting signals at the output of second summation block 142 have frequencies, ordering from lowest to highest, of 880.03, 880.12, 880.21, 880.30, 880.39, 880.48, 880.57, 880.66, 880.75, 880.84, ... 885.52, 885.61 MHz. This sequence has 63 frequencies with a common spacing of 90 KHz. The output of summation block 142 are coupled to a high pass filter 130. If filter 130 passes frequencies greater than or equal to 880.30 MHz the number of frequencies is reduced to 60.

Carrier-frequency oscillator 102, frequency-spacing oscillators 101, 103 are conventional oscillators and are well known in the art. In addition, mixers 121, 122, multiplier 110, summation blocks 141, 142 and high pass filter 130 are also conventional and are well known in the art.

The embodiment described above is capable of providing 60 frequencies with a 90 Khz separation. It is possible to use the same interference simulator frequency generator 100, shown in FIG. 1, for providing other frequency spacings and frequency ranges. The formulas for selecting values for the components in interference simulator frequency generation 100 is given below.

In the following description, the symbol d is used to designate the desired frequency-spacing. The symbol fc is used to designate the carrier frequency at carrier-frequency oscillator 102. The symbol fm is used to designate the highest frequency generated by interference simulator frequency generator 100. The symbol fo is used to designate the frequency of the signal generated by first frequency-spacing oscillator 101. Finally, the symbol L is used to designate the multiplication factor of multiplier 110, i.e., multiplier 110 generates L signals having frequencies equal to integral multiples of an input signal.

The frequency of the signal generated by first frequency- spacing oscillator 101 is chosen to be fo=(3*d). As a result, there are L different signals having frequencies of fo, (2*fo), ..., (L*fo) present at node A. These L signals are processed by first mixer 121 to generate (2*L) signals having frequencies fc+fo, fc−fo, fc+(2*fo), fc−(2*fo), ..., fc+(L*fo), fc−(L*fo). Since the number of signals at node B is equal to the sum of the number of signals generated by first mixer 121 and the number of carrier signal, there are (2*L+1) signals at node B.

The frequency of the signal generated by second frequency spacing oscillator 103 is chosen to be equal to d, the desired frequency-spacing. The (2*L+1) signals at node B is processed by second mixer 122 to generate 2*(2*L+1) signals having frequencies fc+fo−d, fc+fo+d, fc−fo−d, fc−fo+d, ... fc+(L*fo)−d, fc+(L*fo)+d, fc−(L*fo)−d, fc−(L*fo)+d. These 2*(2*L+1) signals at node C together with the (2*L+1) signals at node B are combined together by second summation block 142. Thus, the total number of signals M' coupled to high pass filter 130 is equal to $$M' = (2*L+1) + 2*(2*L+1) = 6*L+3. \qquad (1)$$

The formula for selecting the carrier frequency is now derived. As was described above, the (6*L+3) signals at second summation block 142 comprise the carrier signal, (3*L+1) signals having a frequency higher than the carrier frequency, and (3*L+1) signals having a frequency lower than the carrier frequency. If the highest frequency, fm, generated by interference frequency generation circuit 100 is known, the carrier frequency is given by $$fc = fm - (3*L+1)*d. \qquad (2)$$

Some of the M, signals generated by second summation block 142 are filtered out by high pass filter 130. As a result, only M signals, where M<M', are generated by signal generator 100. Typically, the multiplication factor L is chosen to be equal to M divided by six. The cutoff frequency of high pass filter 130 is chosen such that three signals generated by second summation block 142 having the lowest frequencies are filtered out.

If it is desirable to generate more frequencies than can be provided by a two-mixer system shown in interference simulator frequency generator circuit 100, a three-mixer system can be used. Such a system is shown in interference simulator frequency generator 200 of FIG. 2.

Interference simulator frequency generator 200 comprises a basic block 250, a mixing block 260, and a high pass filter 230. Except for the absence of a filter, basic block 250 has the same structure as interference simulator frequency generator 100, shown in FIG. 1, but the component values are different, as is explained below. Basic block 250 comprises a first frequency-spacing oscillator 201, a carrier-frequency oscillator 202, a second frequency-spacing oscillator 203, a first mixer 221, a second mixer 222, a first summation block 241, a second summation block 242, and a multiplier 210. Mixing block 260 comprises a third frequency-spacing oscillator 204, a third summation block 243, and a third mixer 223. Thus, a three-mixer system is formed by attaching a mixing block comprising an oscillator, a summation block, and a mixer to a two-mixer system.

First frequency-spacing oscillator 201 generates a signal having a frequency of (9*d), where d is the frequency-spacing, as discussed above. First frequency-spacing oscillator 201 is coupled to multiplier 210 having a multiplication factor L. The output of multiplier 210 is coupled to first mixer 221. Mixer 221 also accepts output from carrier-frequency oscillator 202 which generates a carrier signal having a carrier frequency fc. The outputs of first mixer 221 and carrier-frequency oscillator 202 are coupled to first summation block 241.

The output of first summation block 241 is used as input to second mixer 222 and second summation block 242. Second mixer 222 also accepts input from second frequency-spacing oscillator 203 which generates a signal having a frequency of (3*d). The output of second mixer 222 is coupled to second summation block 242. The output of second summation block 242 is coupled out of basic block 250 through an output port 252.

The signal from output port 252 is coupled to mixing block 260 through an input port 262. This signal is coupled to third mixer 223 and third summation block 243. Third mixer also accepts input from third frequency-spacing oscillator 204 which generates signals having a frequency of d, the frequency-spacing. The output of third mixer 223 is coupled to third summation block 243. The output of third summation block, which is the sum of the signals from input port 262 and third mixer 223, is coupled out of an output port 266 of mixing block 260. Output port 266 is coupled to high pass filter 230.

The total number of frequencies, $M_t$, generated by interference simulator frequency generator 200 is given by $$M = 18L + 9 \qquad (3)$$

The carrier frequency, fc, is given by $$fc = fm - (9L + 4)*d \qquad (4)$$

If it is desirable to generate more frequencies than can be provided by the three-mixer system described above, a N-mixer system can be used. An embodiment of a N-mixer interference simulator frequency generator 300 according to the present invention is shown in FIG. 3. Interference simulator frequency generator 300 comprises a basic block 350, a high pass filter 330, and a plurality of (N-2) mixing blocks 360, . . . , 370, . . . , 380. Basic block 350 has the same structure as basic block 250 in FIG. 2. However, the component values are determined from a different set of formulas, as is explained below. Output port 352 of basic block 350 corresponds to output port 252 of basic block 250.

Each mixing block comprises a frequency-spacing oscillator, a mixer, a summation block, an input port and an output port. The output of the frequency-spacing oscillator is coupled to the mixer. The frequency of the signal generated from the frequency-spacing oscillator in each mixing block is determined by an algorithm, the detail of which is described below. The output of the mixer is coupled to the summation block. The signals from the input port are coupled both to the mixer and the summation block. The signals generated by the summation block in the mixing block is coupled to the output port. Thus, the signals from frequency-spacing oscillators 304, 305, and 306 in mixing blocks 360, 370, and 380, respectively, are coupled to mixers 323, 324, and 325, respectively. Input ports 362, 372, and 382 are coupled to mixers 323, 324, and 325, respectively, and summation blocks 343, 344, and 345, respectively. The outputs from mixers 323, 324, and 325 are coupled to summation blocks 343, 344, and 345, respectively. The outputs of summation blocks 343, 344, and 345 are coupled to output ports 366, 376, and 386, respectively.

The coupling among the mixing blocks is now described. Output port 352 of basic block 350 is coupled to input port 362 of mixing block 360. Output port 366 of mixing block 360 is coupled to the input port of the next mixing block. In general, the mixing blocks are chained together such that the output port of one mixing block is coupled to the input port of another mixing block. However, output port 386 of mixing block 380 is coupled to filter 330 instead of another mixing block.

The algorithm to determine the frequency of the signals generated by the frequency spacing oscillators is now described. For convenience, block 380 is labelled as the first block and block 360 is labeled as the (N-2)th, i.e., the last, block. The mixing blocks in the chain between blocks 360 and 380 are labelled sequentially.

The frequency, foi, of the signals generated by the ith frequency-spacing oscillator is given by $$foi = 3^{(i-1)} * d \qquad (5)$$

where d is the desired frequency-spacing. Applying the above formula, it can be determined that the frequency-spacing oscillator of the first block, i.e., oscillator 306 in FIG. 3, should generate signals having a frequency of d. The above formula also indicates that the frequency-spacing oscillator of the (N-2)th mixing block, i.e., oscillator 304 in FIG. 3, should generate signals having a frequency of $(3^{(N-3)} * d)$.

As was described above, basic block 350 has the same structure as basic block 250 in FIG. 2. Thus, basic block 350 also has two frequency-spacing oscillators, one coupled to a mixer and the other coupled to a multiplier. The frequency of the signals generated by the frequency-spacing oscillator coupled to the mixer is $(3^{(N-2)} * d)$. The frequency of the signals generated by the frequency- spacing oscillator coupled to the multiplier is $(3^{(N-1)} * d)$.

The formula for the total number of frequencies generated by interference simulator frequency generator 300 is given by $$M = 3^{(N-1)} * (2*L + 1) \qquad (6)$$

The formula for the carrier frequency, fc, is given by $$fc = fm - (M - 1)/2 \qquad (7)$$

What was described above is an apparatus and method for generating a plurality of signals having evenly-spaced frequencies. However, it is also possible to combine two of the interference simulator frequency generators to generate two sets of signals separated by a predetermined gap in frequency. The carrier frequencies of the two interference simulator frequency generators should be chosen such that the lowest frequency generated by the first interference simulator frequency generator and the highest frequency generated by the second interference simulator frequency generator are separated by the predetermined gap in frequency. Similarly, it is also possible to combine a plurality of interference simulator frequency generators to generate a plurality of frequency gaps.

It is understood that the functions of the component oscillators, mixers, multiplier, and filter are known in the art and that any devices fulfilling those functions are within the scope of the present invention. In addition, the carrier-frequency oscillator in each interference simulator frequency generator could have its own modulation scheme to simulate a desired modulated waveform. The carrier-frequency oscillator capable of performing modulation is well known in the art.

While the above description provides a full and complete description of the preferred embodiments of the present invention, various modifications, alternate constructions and equivalents may be employed. For example, the present invention is not limited to application in mobile communications systems, but can advantageously provide interference simulation for any system utilizing electromagnetic signals. Therefore, the above description and illustrations should not be construed as limiting the scope of the invention which is defined by the following claims.

What is claimed is:

1. A multiple-frequency signal generator for generating a plurality of frequencies having a predetermined frequency-spacing comprising:
   first signal generator means for generating a signal having a first predetermined frequency;
   frequency multiplier means coupled to said signal generator means for providing signals having frequencies which are integral multiples of said first predetermined frequency;
   carrier signal generator means for providing a carrier signal having a carrier frequency;
   first mixing means coupled to said frequency multiplier means and said carrier signal generator means for generating signals having frequencies being at least some of the sums and differences between said carrier frequency and the frequencies of signals generated by said frequency multiplier means;
   second signal generator means for generating a signal having a second predetermined frequency;
   second mixing means, coupled to said second signal generator means, said first mixing means, and said carrier signal generator means, for generating signals having frequencies which are at least some of the sums and differences between the frequencies of said signals generated by said carrier signal generator means and said first mixing means and said second predetermined frequency;
   filter means for filtering signals coupled thereto; and
   means for coupling said carrier signal and signals generated by said first and second mixing means to said filter means.

2. The signal generator of claim 1 wherein said second predetermined frequency is substantially the same as said predetermined frequency-spacing and said first predetermined frequency is substantially the same as three times said predetermined frequency-spacing.

3. The signal generator of claim 2 wherein said frequency of said carrier signal is substantially equal to $fm-(3*L+1)*d$, where fm is the highest frequency generated by said signal generator, d is said predetermined frequency-spacing, and L is the number of signals generated by said frequency multiplier means.

4. The signal generator of claim 1 further comprises:
   third signal generator means for generating a signal having a third predetermined frequency;
   third mixing means, coupled to said third signal generator means, said second mixing means, said first mixing means, and said carrier signal generator means, for generating signals having frequencies being at least some of the sums and differences between the frequencies of said signals generated by said second mixing means and said third predetermined frequency, at least some of the sums and differences between the frequencies of said signals generated by said first mixing means and said third predetermined frequency, and the sum and difference between said carrier frequency and said third predetermined frequency; and
   means for coupling said signals generated by said third mixing means to said filter means.

5. The signal generator of claim 4 wherein said third predetermined frequency is substantially the same as said predetermined frequency-spacing, said second predetermined frequency is substantially the same as three times said predetermined frequency-spacing, and said first predetermined frequency is substantially the same as nine times said predetermined frequency-spacing.

6. The signal generator of claim 5 wherein the frequency of said carrier signal is substantially equal to $fm-(9*L+4)*d$, where fm is the highest frequency generated by said signal generator, d is said predetermined frequency-spacing, and L is the number of signals generated by said frequency multiplier means.

7. The signal generator of claim 1 wherein said carrier signal generator means comprises means for generating a carrier signal having a predetermined modulated waveform.

8. A multiple-frequency signal generator for generating a plurality of frequencies having a predetermined frequency-spacing comprising:
   first signal generator means for generating a signal having a first predetermined frequency;
   frequency multiplier means coupled to said signal generator means for providing signals having frequencies which are integral multiples of said first predetermined frequency;
   carrier signal generator means for providing a carrier signal having a carrier frequency;
   first mixing means coupled to said frequency multiplier means and said carrier signal generator means for generating signals having frequencies being at least some of the sums and differences between said carrier frequency and the frequencies of signals generated by said frequency multiplier means;
   second signal generator means for generating a signal having a second predetermined frequency;
   second mixing means, coupled to said second signal generator means, said first mixing means, and said carrier signal generator means, for generating signals having frequencies which are at least some of the sums and differences between the frequencies of said signals generated by said carrier signal generator means and said first mixing means and said second predetermined frequency;
   filter means for filtering signals coupled thereto;
   a plurality of K mixing blocks comprising a first mixing block, a Kth mixing block, and (K-2) mixing blocks, each of said K mixing blocks having an input port and an output port, the input port of said Kth mixing block being coupled to said carrier signal generator means and said first and said second mixing means, the input port of each of said (K-2) mixing blocks and said first mixing block being coupled to a corresponding output port of said (K-2) mixing blocks and said Kth mixing block, each of said K mixing blocks generating signals having frequencies as a function of the frequencies of the signals at its input port; and means for coupling the output port of said first mixing block to said filter means.

9. The signal generator of claim 8 wherein each of said plurality of mixing blocks comprising:

an oscillator for generating a signal having a predetermined oscillator frequency;

mixing means, coupled to said input port and said oscillator, for generating signals having frequencies substantially equal to the sums and differences between the frequencies of signals at said input port and said predetermined oscillator frequency; and means for coupling said signals from said mixing means and said signals from said input port to said output port.

10. The signal generator of claim 9 wherein said predetermined oscillator frequency is substantially equal to $3^{(J-1)} *d$, where d is said predetermined frequency-spacing, J is an integer designating the mixing means in said signal generator, said mixing means being assigned an integer such that the mixing means are numbered sequentially starting from said first mixing block.

11. A method for generating a plurality of frequencies having a predetermined frequency-spacing, comprising the steps of:

generating a first signal having a first predetermined frequency;

integrally frequency-multiplying said first signal;

generating a carrier signal;

mixing said integrally frequency-multiplied first signal and said carrier signal to produce a first mixed signal comprising signals having frequencies substantially equal to the sums and differences between said carrier signal and said integrally frequency-multiplied signals;

generating a second signal having a second predetermined frequency;

mixing said first mixed signal and said carrier signal with said second signal to produce a second mixed signal; and filtering said first mixed signal, said carrier signal and second mixed signal.

12. The method of claim 11 wherein said frequency-spacing is equal to d, said first predetermined frequency is substantially equal to 3*d, and said second predetermined frequency is substantially equal to d.

* * * * *